(12) United States Patent
Saito (10) Patent No.: US 7,816,756 B2
(45) Date of Patent: Oct. 19, 2010

(54) POWER SEMICONDUCTOR DEVICE

(75) Inventor: Wataru Saito, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 637 days.

(21) Appl. No.: 11/693,157

(22) Filed: Mar. 29, 2007

(65) Prior Publication Data

US 2007/0228462 A1 Oct. 4, 2007

(30) Foreign Application Priority Data

Apr. 3, 2006 (JP) .............................. 2006-102388

(51) Int. Cl.
  *H01L 29/66* (2006.01)
  *H01L 21/02* (2006.01)
  *H01L 29/78* (2006.01)

(52) U.S. Cl. ...................... 257/492; 257/493; 257/328; 257/288; 257/302; 257/341; 257/342; 257/E29.021; 257/E29.027

(58) Field of Classification Search ................. 257/328, 257/288, 302, 341, 342, E29.021, E29.027, 257/492, 493
See application file for complete search history.

(56) References Cited

U.S. PATENT DOCUMENTS

| | | | |
|---|---|---|---|
| 5,216,275 | A | 6/1993 | Chen |
| 6,081,009 | A | 6/2000 | Neilson |
| 6,693,338 | B2 | 2/2004 | Saitoh et al. |
| 6,849,880 | B1 | 2/2005 | Saito et al. |
| 6,888,195 | B2 * | 5/2005 | Saito et al. ................... 257/328 |
| 6,919,610 | B2 | 7/2005 | Saitoh et al. |
| 2005/0133859 | A1 | 6/2005 | Kuwahara et al. |
| 2006/0220156 | A1 | 2/2006 | Saito et al. |

FOREIGN PATENT DOCUMENTS

| | | | |
|---|---|---|---|
| JP | 2003-101022 | | 4/2003 |
| JP | 20040119611 | * | 4/2004 |

OTHER PUBLICATIONS

U.S. Appl. No. 12/050,405, filed Mar. 18, 2008, Saito, et al.

* cited by examiner

*Primary Examiner*—Zandra Smith
*Assistant Examiner*—Tsz K Chiu
(74) *Attorney, Agent, or Firm*—Oblon, Spivak, McClelland, Maier & Neustadt, L.L.P.

(57) ABSTRACT

A power semiconductor device includes: a second semiconductor layer of the first conductivity type and a third semiconductor layer of a second conductivity type formed on a first semiconductor layer and alternately arranged along at least one direction parallel to an upper face of the first semiconductor layer; a fourth semiconductor layer of the second conductivity type selectively formed in an upper face of the second and third semiconductor layers; and a control electrode formed above the second, third and fourth semiconductor layers via a gate insulating film. The control electrode includes: first portions periodically arranged along a first direction selected from arranging directions of the third semiconductor layer, the third semiconductor layer has a shortest arrangement period in the first direction, and second portions periodically arranged along a second direction, the second direction being parallel to the upper face of the first semiconductor layer and crossing the first direction. The arrangement period of the first portions is m times the arrangement period of the third semiconductor layer, where m is an integer not less than 2.

20 Claims, 10 Drawing Sheets

POWER SEMICONDUCTOR DEVICE

CROSS-REFERENCE TO RELATED APPLICATIONS

This application is based upon and claims the benefit of priority from the prior Japanese Patent Application No. 2006-102388, filed on Apr. 3, 2006; the entire contents of which are incorporated herein by reference.

BACKGROUND OF THE INVENTION

1. Field of the Invention

This invention relates to a power semiconductor device, and more particularly to a power semiconductor device having a superjunction structure.

2. Background Art

The ON resistance of a vertical power MOSFET (Metal Oxide Semiconductor Field Effect Transistor) greatly depends on the electric resistance of its conduction layer (drift layer). The dopant concentration that determines the electric resistance of the drift layer cannot exceed a maximum limit, which depends on the breakdown voltage required for a pn junction formed by the base and the drift layer. Thus there is a tradeoff between the device breakdown voltage and the ON resistance. Improving this tradeoff is important for devices with low power consumption. This tradeoff has a limit determined by the device material. Overcoming this limit is the way to realizing devices with low ON resistance beyond existing power devices.

As an example MOSFET for solving this problem, a structure formed by p-pillar layers and n-pillar layers alternately buried in the drift layer is known. This structure is called a superjunction structure. In the superjunction structure, a non-doped layer is artificially produced by equalizing the amount of charge (amount of dopant) contained in the p-pillar layer and the n-pillar layer. Thus, with retaining high breakdown voltage, a current is allowed to flow through the highly doped n-pillar layer, and thereby low ON resistance beyond the material limit can be realized (see e.g. JP 2003-101022A).

As described above, ON resistance is made compatible with the breakdown voltage beyond the material limit by applying the superjunction structure to a vertical power MOSFET. However, for minimizing ON resistance, the amount of dopant in the p-pillar layer and the n-pillar layer needs to be increased as much as possible. For sufficiently depleting the pillar layer having increased dopant concentration, the arrangement period of p-pillar layers and n-pillar layers of the superjunction structure (hereinafter also referred to as "horizontal period") needs to be decreased. More specifically, if the amount of dopant in the p-pillar layer and the n-pillar layer is increased without decreasing the horizontal period, the horizontal electric field required for completely depleting the superjunction structure increases, and the vertical electric field determining the breakdown voltage decreases. Thus the breakdown voltage decreases together with ON resistance. Therefore it is indispensable to decrease the horizontal period of the superjunction structure for reducing ON resistance with maintaining high breakdown voltage.

When the horizontal period of the superjunction structure is decreased, the horizontal period of the MOS gate structure formed on the surface must be also decreased. This is because the MOS gate structure without similar downscaling causes a mismatch with the superjunction structure. However, downscaling the MOS gate structure is difficult, because it involves significant process changes and decreased process margin.

SUMMARY OF THE INVENTION

According to an aspect of the invention, there is provided a power semiconductor device including: a first semiconductor layer of a first conductivity type; a second semiconductor layer of the first conductivity type and a third semiconductor layer of a second conductivity type formed on the first semiconductor layer of the first conductivity type and alternately arranged along at least one direction parallel to an upper face of the first semiconductor layer of the first conductivity type; a first main electrode electrically connected to the first semiconductor layer of the first conductivity type; a fourth semiconductor layer of the second conductivity type selectively formed in an upper face of the second semiconductor layer of the first conductivity type and an upper face of the third semiconductor layer of the second conductivity type; a fifth semiconductor layer of the first conductivity type selectively formed in an upper face of the fourth semiconductor layer of the second conductivity type; a second main electrode electrically connected to the fourth semiconductor layer of the second conductivity type and the fifth semiconductor layer of the first conductivity type; and a control electrode formed above the second semiconductor layer of the first conductivity type, the third semiconductor layer of the second conductivity type, the fourth semiconductor layer of the second conductivity type, and the fifth semiconductor layer of the first conductivity type via a gate insulating film, the control electrode including: first portions periodically arranged along a first direction selected from arranging directions of the third semiconductor layer of the second conductivity type, the third semiconductor layer of the second conductivity type having a shortest arrangement period in the first direction, and second portions periodically arranged along a second direction, the second direction being parallel to the upper face of the first semiconductor layer of the first conductivity type and crossing the first direction, and the arrangement period of the first portions being m times the arrangement period of the third semiconductor layer of the second conductivity type, where m is an integer not less than 2.

According to another aspect of the invention, there is provided a power semiconductor device including: a first semiconductor layer of a first conductivity type; a second semiconductor layer of the first conductivity type and a third semiconductor layer of a second conductivity type formed on the first semiconductor layer of the first conductivity type and alternately arranged along at least one direction parallel to an upper face of the first semiconductor layer of the first conductivity type; a first main electrode electrically connected to the first semiconductor layer of the first conductivity type; a fourth semiconductor layer of the second conductivity type selectively formed in an upper face of the second semiconductor layer of the first conductivity type and an upper face of the third semiconductor layer of the second conductivity type; a fifth semiconductor layer of the first conductivity type selectively formed in an upper face of the fourth semiconductor layer of the second conductivity type; a second main electrode electrically connected to the fourth semiconductor layer of the second conductivity type and the fifth semiconductor layer of the first conductivity type; and a control electrode formed above the second semiconductor layer of the first conductivity type, the third semiconductor layer of the second conductivity type, the fourth semiconductor layer of the second conductivity type, and the fifth semiconductor layer of the first conductivity type via a gate insulating film, the second semiconductor layer of the first conductivity type and the third semiconductor layer of the second conductivity type being formed in a stripe configuration, and the control electrode including: first portions periodically arranged along a first direction, and second portions periodically arranged along a second direction, the second direction crossing the first direction.

According to another aspect of the invention, there is provided a power semiconductor device including: a first semiconductor layer of a first conductivity type; a second semiconductor layer of the first conductivity type and a third semiconductor layer of a second conductivity type formed on the first semiconductor layer of the first conductivity type and alternately arranged along at least one direction parallel to an upper face of the first semiconductor layer of the first conductivity type; a first main electrode electrically connected to the first semiconductor layer of the first conductivity type; a fourth semiconductor layer of the second conductivity type selectively formed in an upper face of the second semiconductor layer of the first conductivity type and an upper face of the third semiconductor layer of the second conductivity type; a fifth semiconductor layer of the first conductivity type selectively formed in an upper face of the fourth semiconductor layer of the second conductivity type; a second main electrode electrically connected to the fourth semiconductor layer of the second conductivity type and the fifth semiconductor layer of the first conductivity type; and a control electrode formed above the second semiconductor layer of the first conductivity type, the third semiconductor layer of the second conductivity type, the fourth semiconductor layer of the second conductivity type, and the fifth semiconductor layer of the first conductivity type via a gate insulating film, one of the second semiconductor layer of the first conductivity type and the third semiconductor layer of the second conductivity type being formed in an island configuration, and equally spaced along the at least one direction, other of the second semiconductor layer of the first conductivity type and the third semiconductor layer of the second conductivity type surrounding the one, and the control electrode including: first portions periodically arranged along the one direction, and second portions periodically arranged along a second direction, the second direction crossing the one direction.

DETAILED DESCRIPTION OF THE INVENTION

Embodiments of the invention will now be described with reference to the drawings. In the following embodiments of the invention, a vertical power MOSFET having a superjunction structure is illustrated as a power semiconductor device. The following embodiments are illustrated assuming the first conductivity type as n-type and the second conductivity type as p-type. Like elements in the drawings are marked with like reference numerals.

First Embodiment

Figure 1:
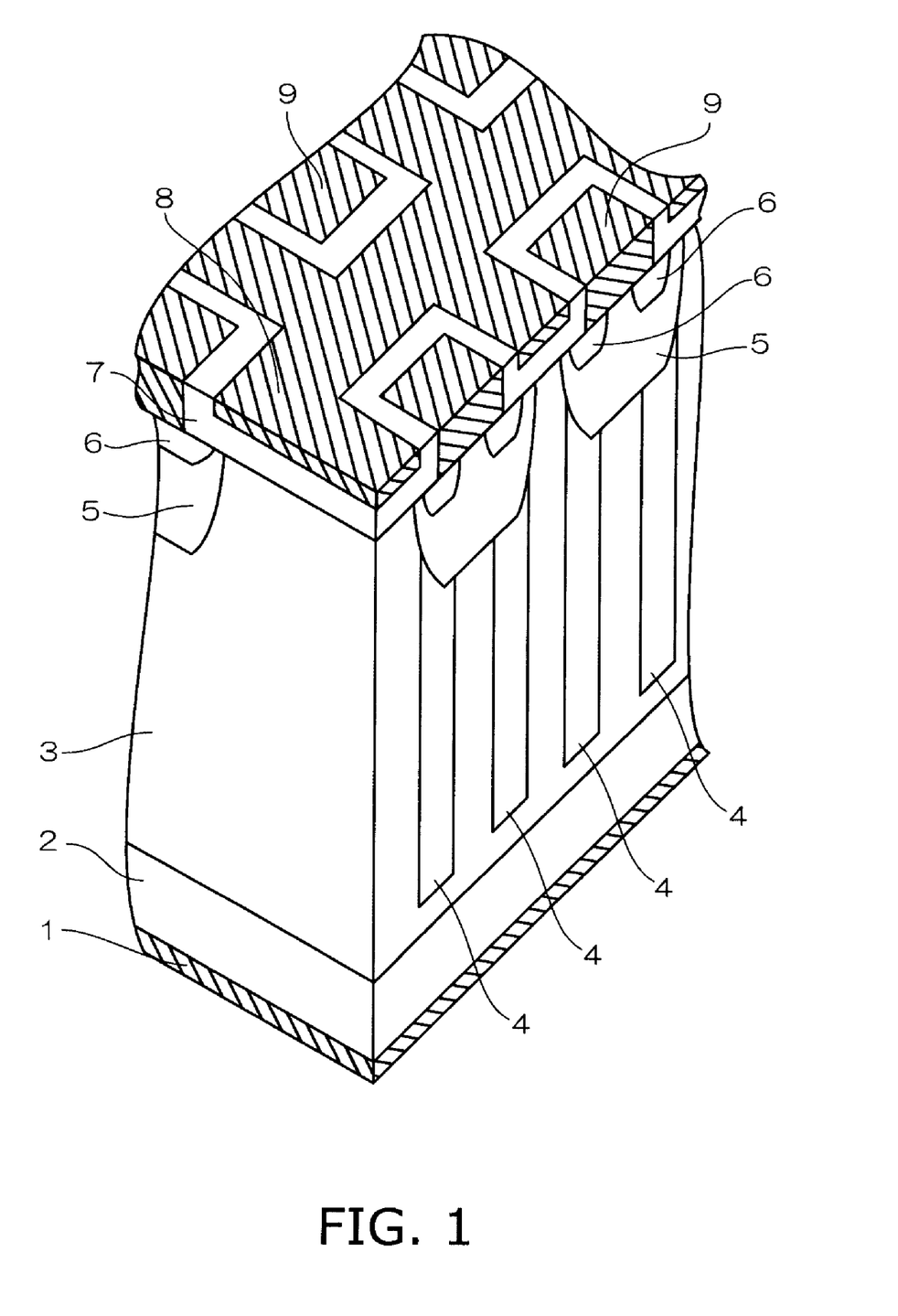
FIG. 1 is a perspective cross-sectional view illustrating a vertical power MOSFET having a superjunction structure according to a first embodiment of the invention.

FIG. 1 is a perspective cross-sectional view schematically illustrating a vertical power MOSFET according to a first embodiment of the invention.

Figure 2:
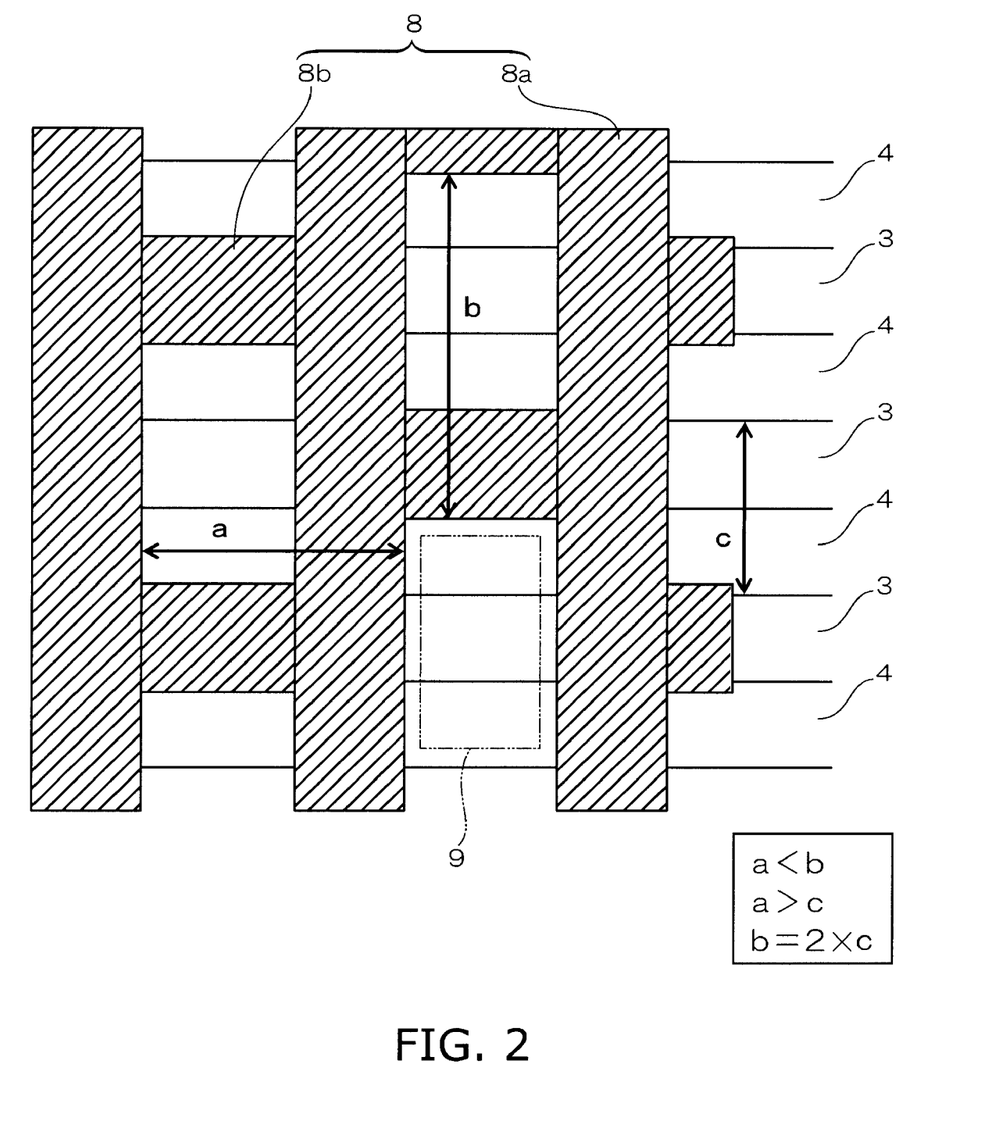
FIG. 2 is a plan view illustrating the positional relationship between the superjunction structure and the gate electrode in the vertical power MOSFET according to the first embodiment.

FIG. 2 is a plan view illustrating the positional relationship between the superjunction structure and the gate electrode in this vertical power MOSFET.

As shown in FIGS. 1 and 2, this MOSFET has an $n^+$-drain layer 2 as a first semiconductor layer. On this $n^+$-drain layer 2, striped n-pillar layers 3 serving as a second semiconductor layer and striped p-pillar layers 4 serving as a third semiconductor layer extend along one direction parallel to the surface of the $n^+$-drain layer 2. The n-pillar layers 3 and the p-pillar layers 4 are alternately arranged along the direction parallel to the surface of the $n^+$-drain layer 2 and orthogonal to the extending direction of the n-pillar layers 3 and the p-pillar layers 4 and constitute a superjunction structure (SJ structure). In the following, the extending direction of the n-pillar layers 3 and the p-pillar layers 4 is referred to as "pillar extending direction", the arranging direction of the n-pillar layers 3 and the p-pillar layers 4 is referred to as "pillar arranging direction", and the direction perpendicular to the surface of the $n^+$-drain layer 2 is referred to as "vertical direction". The pillar extending direction, the pillar arranging direction, and the vertical direction are orthogonal to each other.

A drain electrode 1 serving as a first main electrode is provided on the lower face of the $n^+$-drain layer 2 and electrically connected to the $n^+$-drain layer 2. Furthermore, in part of the upper face of the n-pillar layer 3 and the p-pillar layer 4, that is, in part of the opposite face of the drain electrode 1 side, a p-base layer 5 is formed as a fourth semiconductor layer. In part of the upper face of the p-base layer 5, n-source layers 6 are formed at e.g. two positions as a fifth semiconductor layer. The $n^+$-drain layer 2, the n-pillar layer 3, the p-pillar layer 4, the p-base layer 5, and the n-source layer 6 are illustratively silicon layers doped with impurities.

The upper faces of the n-pillar layer 3, the p-pillar layer 4, the p-base layer 5, and the n-source layer 6 constitute a common plane. On this plane, a gate electrode 8 is formed as a control electrode via a gate insulating film 7 made of a silicon oxide film having a film thickness of about 0.1 micron, for example. As described later, the gate electrode 8 is shaped like a staggered grid as viewed from above. One rectangular island-shaped source electrode 9 is provided as a second main electrode at each position surrounded by the gate electrode 8. The source electrode 9 is in contact with the upper face of the p-base layer 5 and the n-source layer 6. The source electrode 9 and the gate electrode 8 are insulated by the gate insulating film 7.

FIG. 2 shows the positional relationship between the superjunction structure and the gate electrode 8 as viewed from above. As shown in FIG. 2, the gate electrode 8 is composed of a plurality of portions 8a (second portions) extending linearly in the pillar arranging direction and a plurality of portions 8b (first portions) connecting between adjacent portions 8a and extending in the pillar extending direction. The portions 8a are periodically arranged along the pillar extending direction, and the portions 8b are periodically arranged along the pillar arranging direction.

The portions 8a continuously extend in the pillar arranging direction, whereas the portions 8b are offset for each region between the portions 8a with respect to the pillar arranging direction. More specifically, the phase in the pillar arranging direction for the portion 8b in one region between the portions 8a is out of phase by half the period relative to the phase in the pillar arranging direction for the portion 8b in another region between the portions 8a located adjacent to the one region. Thus the gate electrode 8 is formed like a staggered grid, which is offset as viewed from above. The width of the portion 8b of the gate electrode 8 is slightly larger than the width of the n-pillar layer 3. The portion 8b covers an n-pillar layer 3 and part of the p-pillar layers 4 on both sides thereof. In FIG. 2, for convenience, the boundary between the portion 8a and the portion 8b is indicated by a straight line. However, in fact, the portion 8a and the portion 8b are integrally formed. This also applies to FIGS. 5 and 9 described later.

In conventional structures, the gate electrodes are arranged in the pillar arranging direction, and the gate electrodes and the pillar layers have an equal arrangement period. This results in a superjunction structure where a p-pillar layer 4 is located only at the center of the p-base layer 5. In this case, with the downscaling of the superjunction structure, the MOS gate structure must also be downscaled. However, downscaling the MOS gate structure is impractical, because it involves significant process changes such as shallowing the p-base layer 5 for avoiding the increase of its resistance, and decreased process margin due to the narrowed spacing between the gate electrode 8 and the source electrode 9.

On the other hand, the arranging direction of the gate electrodes may be made different from the pillar arranging direction so that the gate electrodes and the pillar layers may have different arrangement periods.

Figure 3:
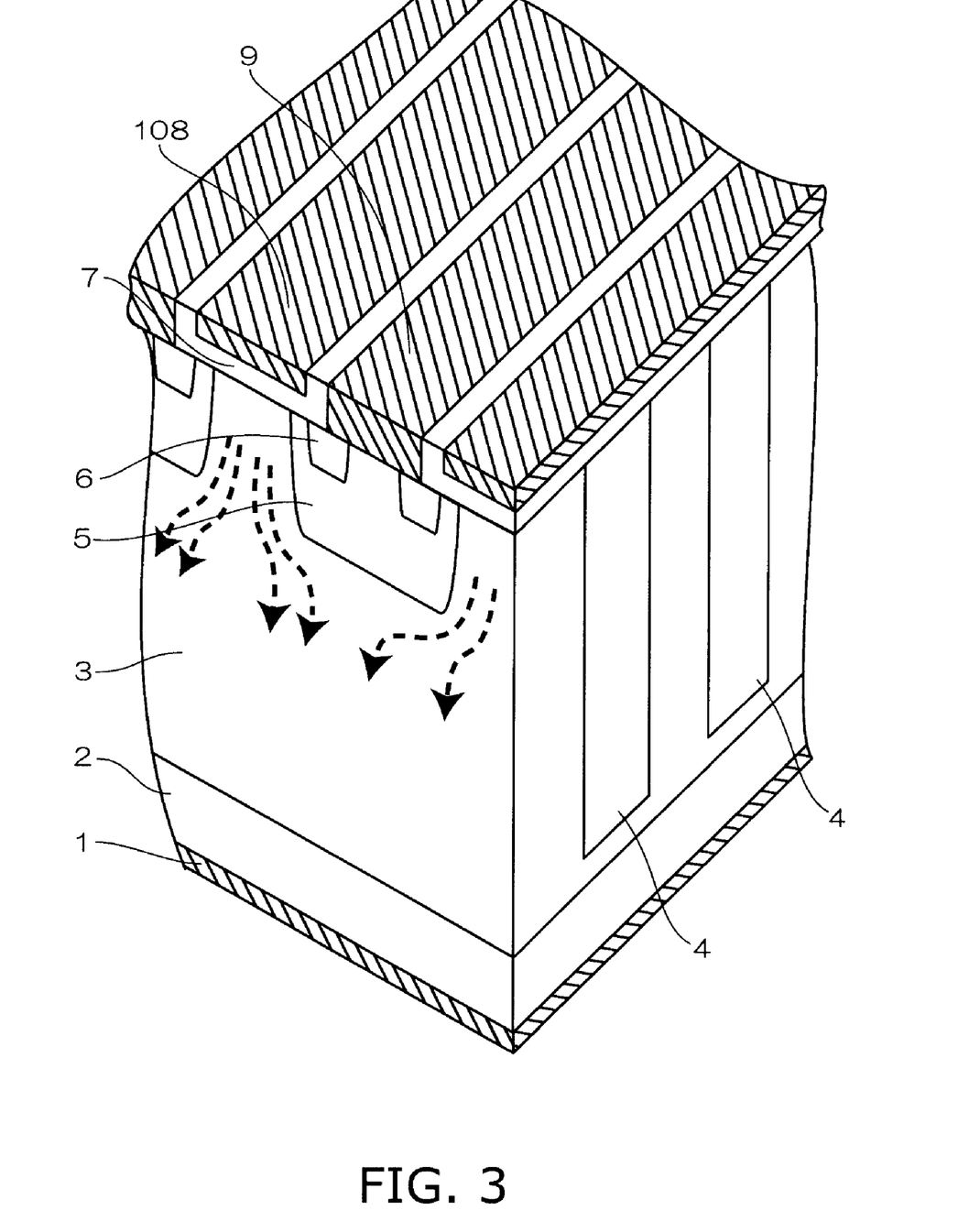
FIG. 3 is a perspective cross-sectional view showing a vertical power MOSFET according to a comparative example.

FIG. 3 is a perspective cross-sectional view showing a vertical power MOSFET according to a comparative example of the invention.

As shown in FIG. 3, striped gate electrodes 108 may be arranged orthogonal to the striped n-pillar layers 3 and p-pillar layers 4 constituting the superjunction structure. Then a device can be formed even if their arrangement periods are not equal.

Under the action of the gate electrode 108, this structure can ensure a current path along which electrons flow from the source electrode 9 through the n-source layer 6 and the p-base layer 5 to the n-pillar layer 3. However, the overall device has an increased ON resistance. More specifically, as shown by arrows in the figure, electrons injected from the p-base layer 5 into the portion of the n-pillar layer 3 between the p-base layers 5 flow with spreading in the portion of the n-pillar layer 3 below the p-base layers 5. Here, the ON resistance increases because of the elongated current path detouring below the p-base layer 5.

In contrast, according to this embodiment, the gate electrodes 8 are arranged in a pattern like a staggered grid as shown in FIG. 2. Hence the average length of the detouring current path can be substantially half that for the device shown in FIG. 3, and the spreading resistance below the p-base layer 5 can be reduced substantially by half. As described above, in the gate electrode 8 of the structure shown in FIGS. 1 and 2, a portion 8b extending in the pillar extending direction is formed between portions 8a extending in the pillar arranging direction. Because the portion 8b is provided, electrons are directly injected from the MOS channel into the n-pillar layer 3 directly below the portion 8b, and hence no spreading resistance occurs. That is, the spreading resistance below the p-base layer 5 occurs only in the region where the portion 8b is not formed. The portions 8b are formed in every two regions between the portions 8a, that is, cover substantially half the upper face of the n-pillar layer 3. Thus, according to this embodiment, the spreading resistance can be reduced substantially by half relative to the comparative example shown in FIG. 3.

The arrangement period c of the superjunction structure, that is, the arrangement period c of the n-pillar layers 3 does not depend on the arrangement period a of the portions 8a in the pillar extending direction. The arrangement period b of the portions 8b in the pillar arranging direction is twice the arrangement period c of the superjunction structure. Thus the arrangement period c of the superjunction structure can be downscaled to half the downscaling limit of the planar gate structure. On the other hand, the spreading resistance described above can be decreased by reducing the arrangement period a of the portions 8a. Hence the arrangement period a is preferably shorter than the arrangement period b.

Thus, according to this embodiment, the gate electrode 8 has portions 8a extending in the pillar arranging direction and portions 8b extending in the pillar extending direction. Hence the period of the superjunction structure and the period of the MOS gate structure can be designed independently. The superjunction structure can be downscaled to reduce the ON resistance of the power MOSFET without downscaling the gate electrode 8 beyond the limit. Furthermore, because the gate electrode 8 is patterned like a staggered grid, the juncture between the portion 8a and the portion 8b is not crossed but three-forked. Thus electric field concentration at the corner of the p-base layer 5 can be alleviated, and the breakdown voltage can be enhanced.

The arrangement period b of the portions 8b of the gate electrode 8 is not limited to twice the arrangement period c of the n-pillar layers 3, but may be m times (where m is an integer not less than 2). Here, the phase of the arrangement of the portions 8b may be offset by 1/m of the period for different regions between the portions 8a. Alternatively, with m being an even number, the phase of the arrangement of the portions 8b may be offset by half the period for adjacent regions between the portions 8a. As the arrangement period b of the portions 8b becomes longer than the arrangement period c of the n-pillar layers 3, the arrangement period c of the n-pillar layers 3 can be reduced, and the superjunction structure can be downscaled, but conversely, the proportion of the n-pillar layer 3 located in the directly underlying region of the gate electrode 8 decreases. Thus it is preferable to determine the relationship between the arrangement period b and the arrangement period c so that low ON resistance is compatible with sufficient process margin.

This embodiment illustrates an arrangement where the portions 8a and 8b are equally spaced, respectively. However, the portions 8a and 8b may have a more complex periodicity. For example, the following arrangement is possible: for five consecutive portions 8b, the spacing between the first portion 8b and the second portion 8b is twice the arrangement period c of the n-pillar layers 3, the spacing between the second portion 8b and the third portion 8b is three times the arrangement period c, the spacing between the third portion 8b and the fourth portion 8b is twice the arrangement period c, and the spacing between the fourth portion 8b and the fifth portion 8b is three times the arrangement period c. In this case, the portions 8b are arranged with a period of five times the arrangement period c, with one period containing two portions 8b.

Second Embodiment

Figure 4:
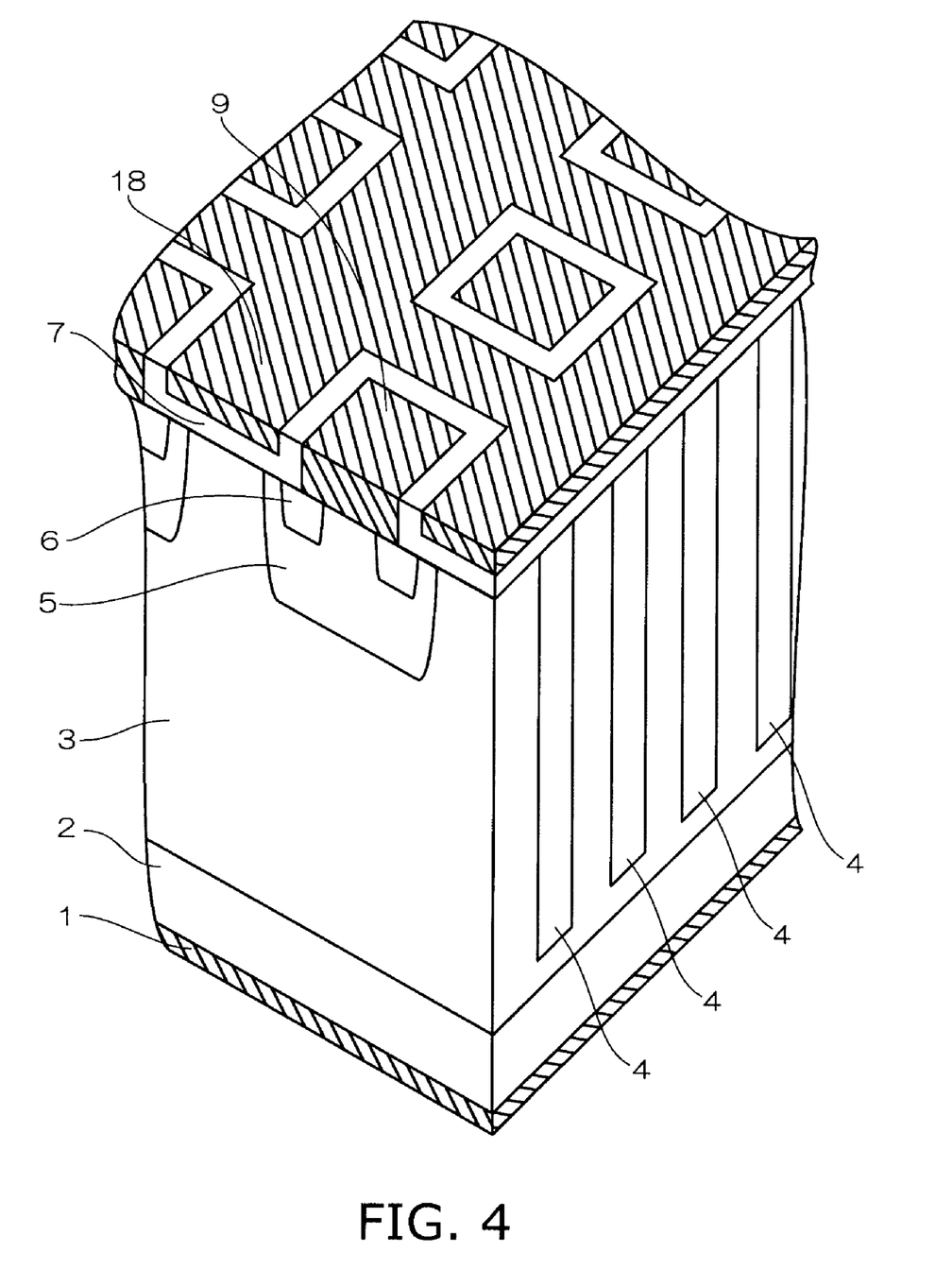
FIG. 4 is a perspective cross-sectional view schematically illustrating a vertical power MOSFET according to a second embodiment of the invention.

FIG. 4 is a perspective cross-sectional view schematically illustrating a vertical power MOSFET according to a second embodiment of the invention.

Figure 5:
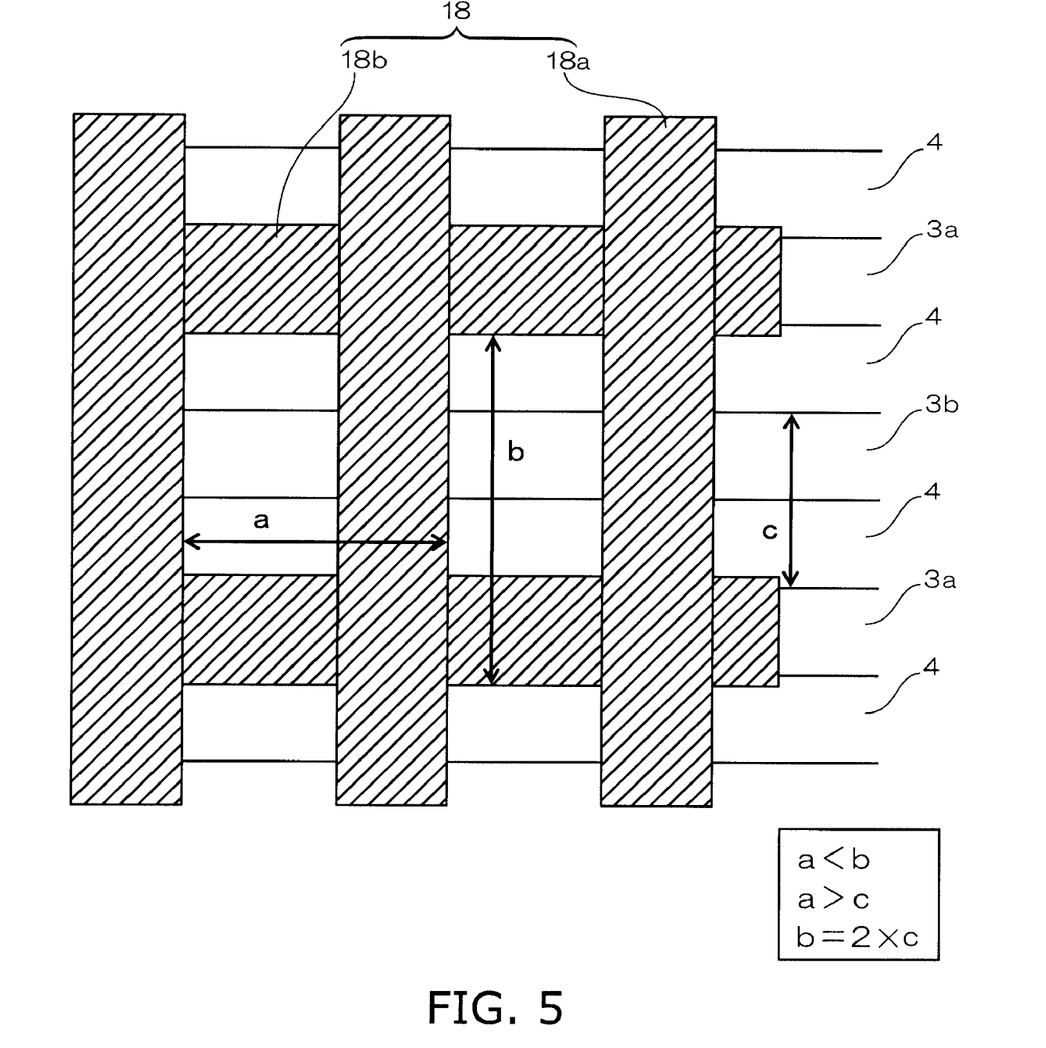
FIG. 5 is a plan view illustrating the positional relationship between the superjunction structure and the gate electrode in the vertical power MOSFET according to the second embodiment.

FIG. 5 is a plan view illustrating the positional relationship between the superjunction structure and the gate electrode in the vertical power MOSFET according to this embodiment.

In the structure shown in FIGS. 4 and 5, the gate electrode 18 is formed in a grid configuration. More specifically, portions 18b of the gate electrode 18 extending in the pillar extending direction are formed in the directly overlying region of one out of two n-pillar layers. That is, a portion 18b is formed in the directly overlying region of one n-pillar layer 3a throughout its length, but no portion 18b is formed in the directly overlying region of an n-pillar layer 3b adjacent to this n-pillar layer 3a.

In the n-pillar layer 3a formed in the directly underlying region of the portion 18b of the gate electrode 18, electrons are directly injected from the MOS channel in the vertical direction without detouring below the p-base layer 5, and hence no spreading resistance occurs. Thus, relative to the comparative example shown in FIG. 3, the spreading resistance of the overall device can be reduced by half. The configuration, operation, and effect of this embodiment other than the foregoing are similar to those of the first embodiment described above.

Furthermore, in this embodiment, the dopant concentration in the n-pillar layer 3b with no portion 18b of the gate electrode 18 being formed in its directly overlying region is higher than the dopant concentration in the n-pillar layer 3a with a portion 18b being formed in its directly overlying region. Thus the ON resistance can be reduced with retaining the breakdown voltage of the overall device.

More specifically, as described above, in the n-pillar layer 3a with a portion 18b being formed in its directly overlying region, no spreading resistance occurs below the p-base layer 5, and hence the ON resistance decreases. However, because the portion 18a of the gate electrode 18 orthogonally crosses the portion 18b in the directly overlying region, corners are formed in the p-base layer 5. Electric field is likely to concentrate on these corners, and the breakdown voltage decreases.

On the other hand, in the n-pillar layer 3b with no portion 18b being formed in its directly overlying region, a high spreading resistance occurs below the p-base layer 5, and the ON resistance increases. However, the gate electrode 18 formed in the directly overlying region is only the portion 18a. Hence the edge of the p-base layer 5 is less susceptible to electric field concentration, and the breakdown voltage increases.

Thus, when the dopant concentration in the n-pillar layer 3b is made higher than the dopant concentration in the n-pillar layer 3a, the breakdown voltage and the ON resistance in the n-pillar layers 3a and 3b can be optimally balanced, respectively, and the ON resistance can be reduced with retaining the breakdown voltage of the overall device. Here, the spreading resistance below the p-base layer 5 is illustratively about 20% of the resistance of the overall n-pillar layer. Thus the dopant concentration in the n-pillar layer 3b is preferably e.g. about 20% higher than the dopant concentration in the n-pillar layer 3a so that the ON resistance is comparable in the n-pillar layer 3a and in the n-pillar layer 3b.

Like this embodiment, also in the MOSFET according to the first embodiment described above (see FIGS. 1 and 2), the dopant concentration in the n-pillar layer 3 can be made different between the region with a portion 8b and the region with no portion 8b of the gate electrode 8 being formed in its directly overlying region. Thus the ON resistance can be reduced with retaining the breakdown voltage.

Third Embodiment

Figure 6:
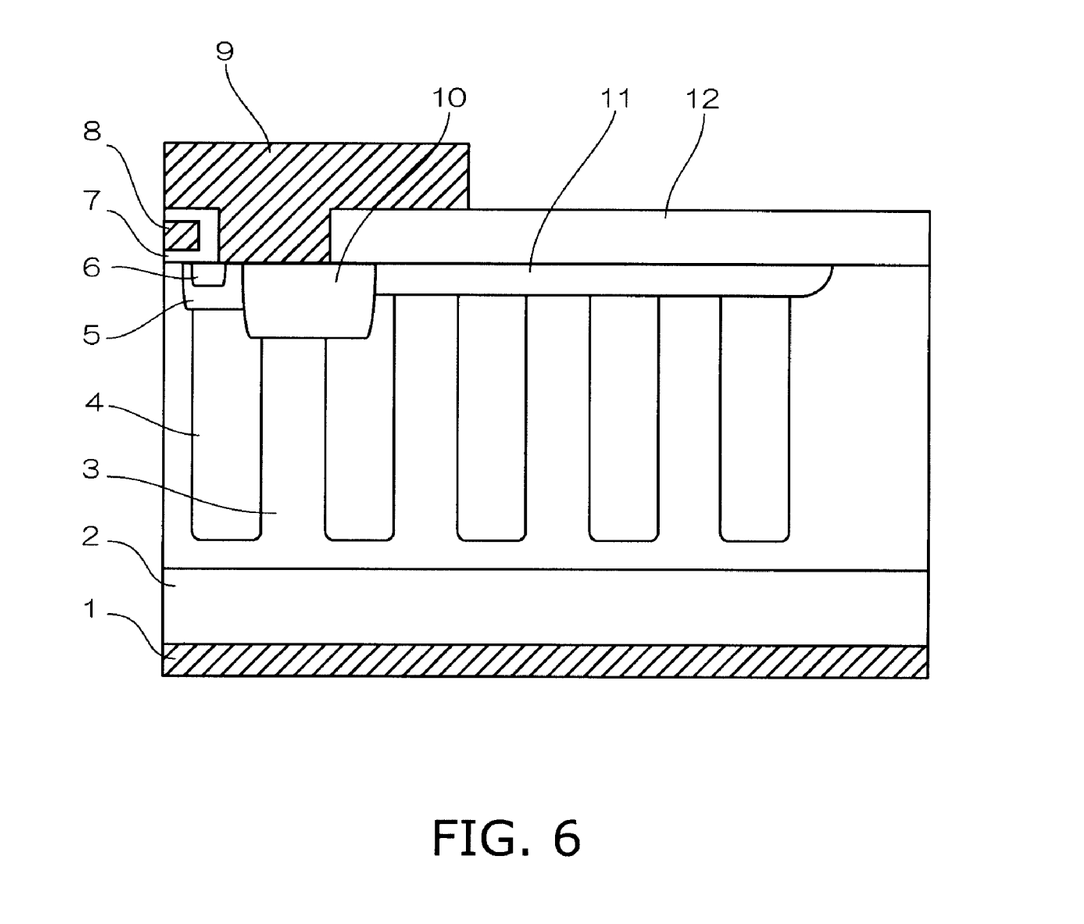
FIG. 6 is a cross-sectional view schematically illustrating a vertical power MOSFET having a superjunction structure according to a third embodiment of the invention.

FIG. 6 is a cross-sectional view schematically illustrating a vertical power MOSFET according to a third embodiment of the invention.

In the structure shown in FIG. 6, a guard ring layer 10 deeper than the p-base layer 5 is formed in the device edge termination section. The guard ring layer 10 is illustratively a p-type layer connected to the source electrode 9. By forming a guard ring layer 10 in the edge termination section, the p-base layer 5 can be shallowed with ensuring sufficient breakdown voltage. Thus the superjunction structure can be further downscaled, and the ON resistance can be reduced.

More specifically, when the arrangement period of the n-pillar layers 3 and the p-pillar layers 4 is reduced without shallowing the p-base layer 5, the width of the portion of the n-pillar layer 3 between the p-base layers 5 decreases, and the resistance of this portion increases. This can be avoided by shallowing the p-base layer 5 on the same scale as the reduction of the width of the portion between the p-base layers 5. However, this results in increasing the curvature of the outer face of the p-base layer 5 and increasing the electric field applied to the outer face of the p-base layer 5 in the device edge termination section. Thus the breakdown voltage decreases. In contrast, in this embodiment, a guard ring layer 10 deeper than the p-base layer 5 is provided in the device edge termination section to alleviate electric field concentration and prevent the decrease of breakdown voltage. Thus a sufficient breakdown voltage in the device edge termination section is ensured even if the arrangement period of the n-pillar layers 3 and the p-pillar layers 4 is reduced and the p-base layer 5 is shallowed. Note that a RESURF layer 11 is formed on the upper face of the n-pillar layers 3 and the p-pillar layers 4 in the device edge termination section, and the upper face of the RESURF layer 11 is covered with an insulating film 12. The configuration, operation, and effect of this embodiment other than the foregoing are similar to those of the first embodiment described above.

Fourth Embodiment

Figure 7:
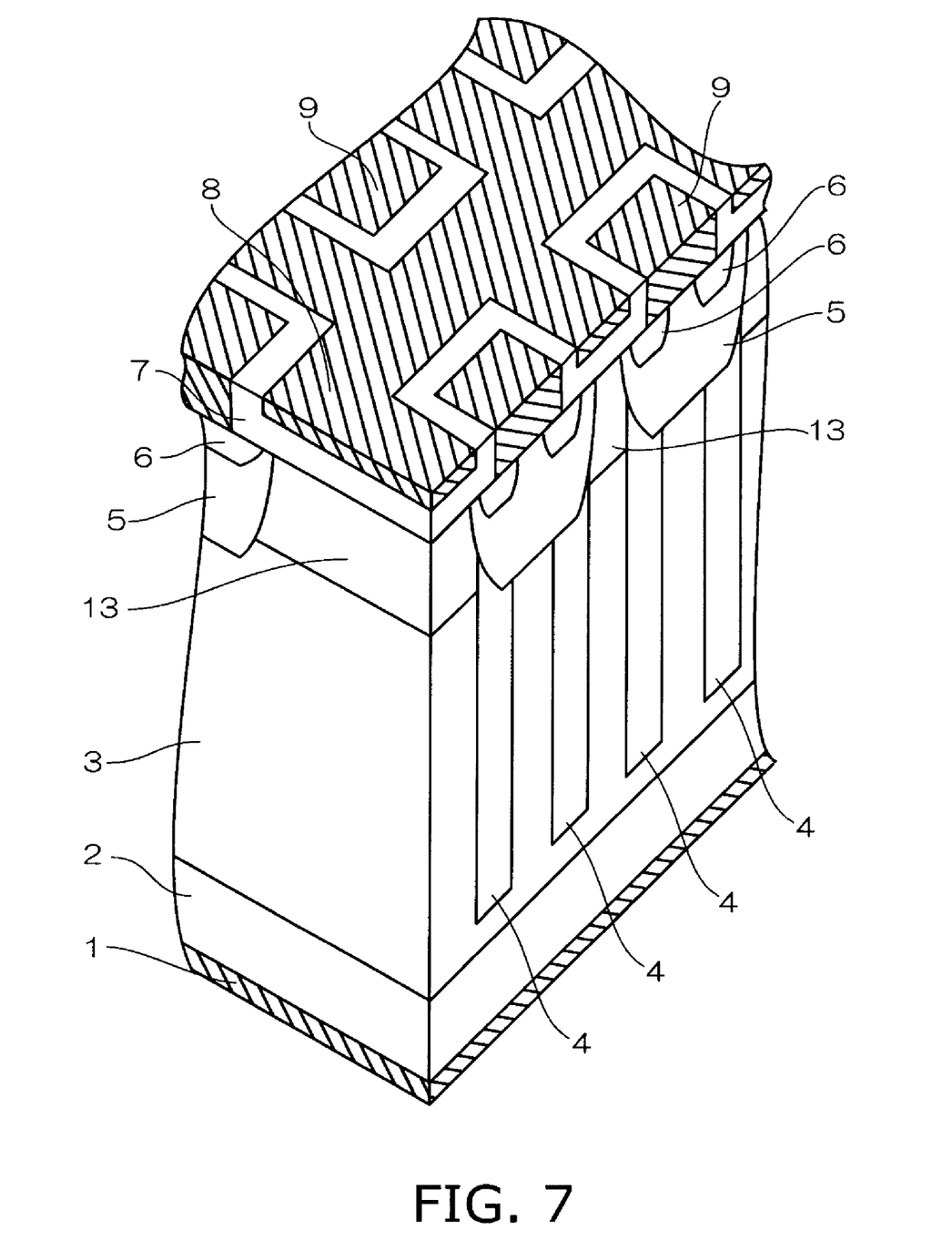
FIG. 7 is a perspective cross-sectional view schematically illustrating a vertical power MOSFET according to a fourth embodiment of the invention.

FIG. 7 is a perspective cross-sectional view schematically illustrating a vertical power MOSFET according to a fourth embodiment of the invention.

In the structure shown in FIG. 7, a highly doped n-layer 13 having a higher dopant concentration than the n-pillar layer 3 is formed in the portion between the p-base layers 5. By forming a highly doped n-layer 13, the resistance of the JFET (Junction Field Effect Transistor) region between the p-base layers 5 can be reduced, and the ON resistance can be further reduced. The dopant concentration in the highly doped n-layer 13 is illustratively twice to three times the dopant concentration in the n-pillar layer 3. The configuration, operation, and effect of this embodiment other than the foregoing are similar to those of the first embodiment described above.

Figure 8:
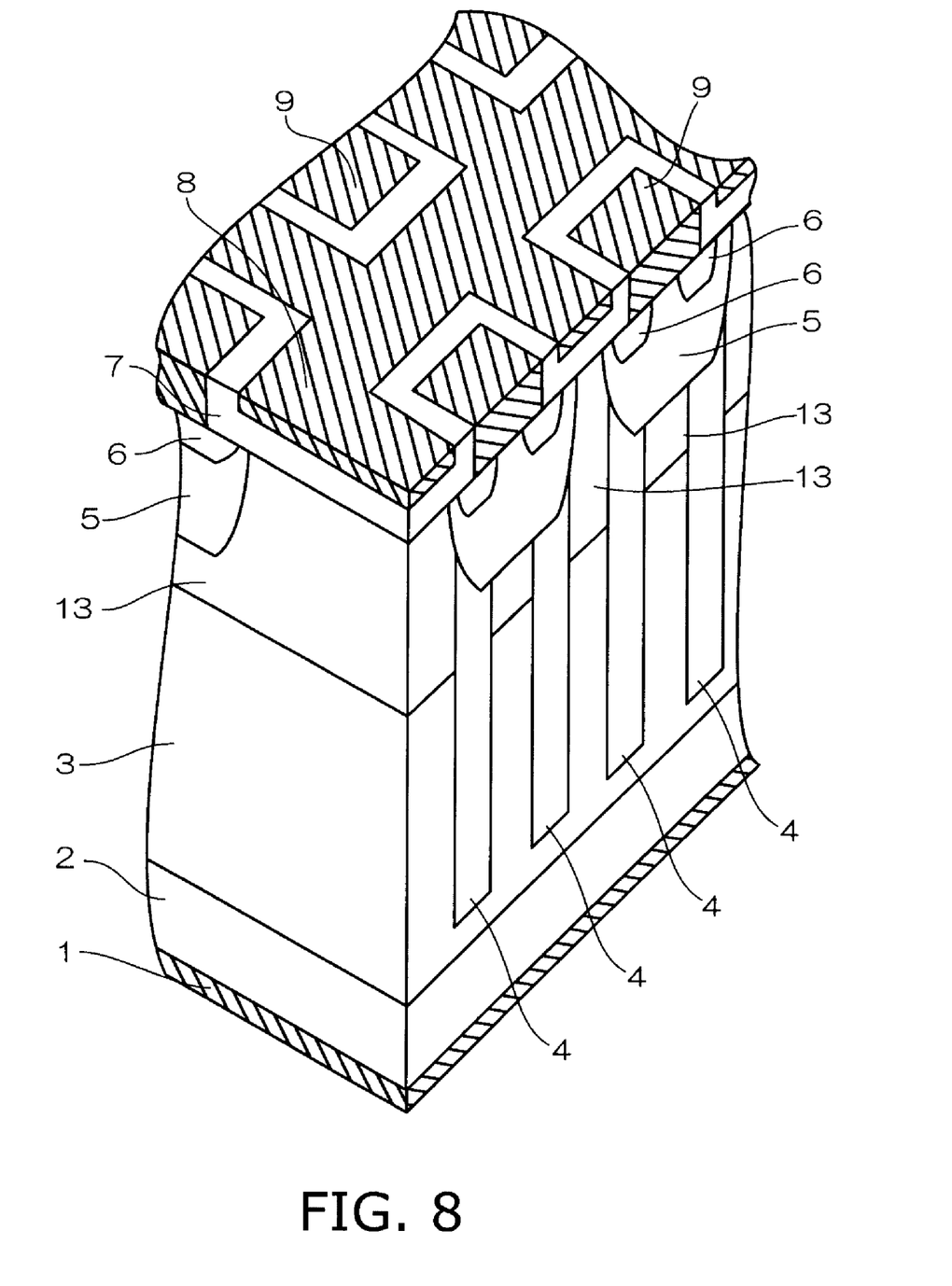
FIG. 8 is a perspective cross-sectional view schematically illustrating a vertical power MOSFET according to a variation of the fourth embodiment.

FIG. 8 is a perspective cross-sectional view schematically illustrating a power MOSFET according to a variation of the fourth embodiment.

As shown in FIG. 8, in this variation, the highly doped n-layer 13 is formed deeper than the p-base layers 5. Thus, by forming a highly doped n-layer 13 deeper than the p-base layers 5, the spreading resistance below the p-base layers 5 can be reduced, and the ON resistance can be further reduced. Preferably, the highly doped n-layer 13 is not formed in the device edge termination section for avoiding the decrease of breakdown voltage. The configuration, operation, and effect of this embodiment other than the foregoing are similar to those of the fourth embodiment described above.

Fifth Embodiment

Figure 9:
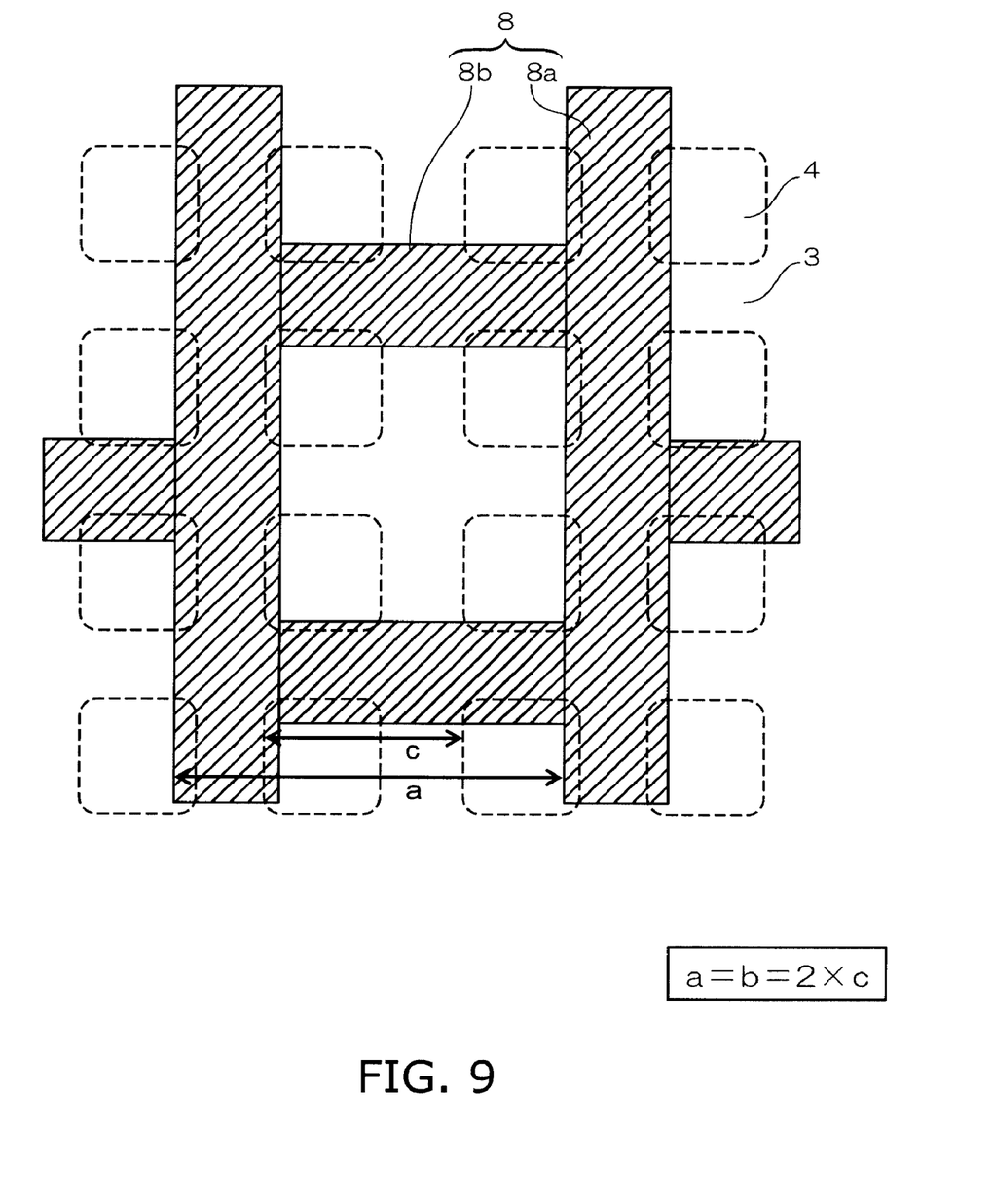
FIG. 9 is a plan view illustrating the positional relationship between the superjunction structure and the gate electrode in a vertical power MOSFET according to a fifth embodiment of the invention.

FIG. 9 is a plan view illustrating the positional relationship between the superjunction structure and the gate electrode in a vertical power MOSFET according to a fifth embodiment of the invention.

In the first to fourth embodiments illustrated above, the n-pillar layers 3 and the p-pillar layers 4 are formed in a striped configuration. In this embodiment, as viewed from above, p-pillar layers 4 formed like rectangular islands are arranged in a matrix configuration, and n-pillar layers 3 surround these p-pillar layers 4 in a grid configuration. For example, the p-pillar layers 4 are equally spaced along two mutually orthogonal directions. Like the embodiments described above, the n-pillar layers 3 and the p-pillar layers 4 extend linearly in the vertical direction, and the n-pillar layers 3 are in contact with the $n^+$-drain layer 2 (see FIG. 1).

Like the first embodiment described above (see FIG. 2), the gate electrode 8 is formed in an offset grid (staggered grid) configuration. The portion 8a of the gate electrode 8 is located in the directly overlying region of every two portions of the grid-shaped n-pillar layer 3 that extend in one direction. The portion 8b is located, between the portions 8a, in the directly overlying region of every two portions of the n-pillar layer 3 that extend in the other direction. Thus the arrangement period a of the portions 8a and the arrangement period b of the portions 8b of the gate electrode 8 are equal to each other and twice the period c of the superjunction structure (i.e. the arrangement period of the n-pillar layers 3). The width of the gate electrode 8 is slightly thicker than the width of the portions of the n-pillar layer 3, and the gate electrode 8 protrudes into part of the directly overlying region of the p-pillar layers 4 on both sides of the n-pillar layer 3 in the directly underlying region. Like the first embodiment, the portion 8a continuously extends along one direction, whereas the arrangement of the portions 8b is out of phase by half the period for every region between the portions 8a.

In this embodiment, as shown in FIG. 9, in the region where the portions 8a and 8b of the gate electrode 8 are formed, electrons flow from the source electrode 9 toward the n-pillar layer 3 through the inversion channel of the MOS gate. Thus the spreading resistance can be reduced in the directly underlying region of the p-base layer, and the ON resistance can be reduced. The configuration, operation, and effect of this embodiment other than the foregoing are similar to those of the first embodiment described above.

Figure 10:
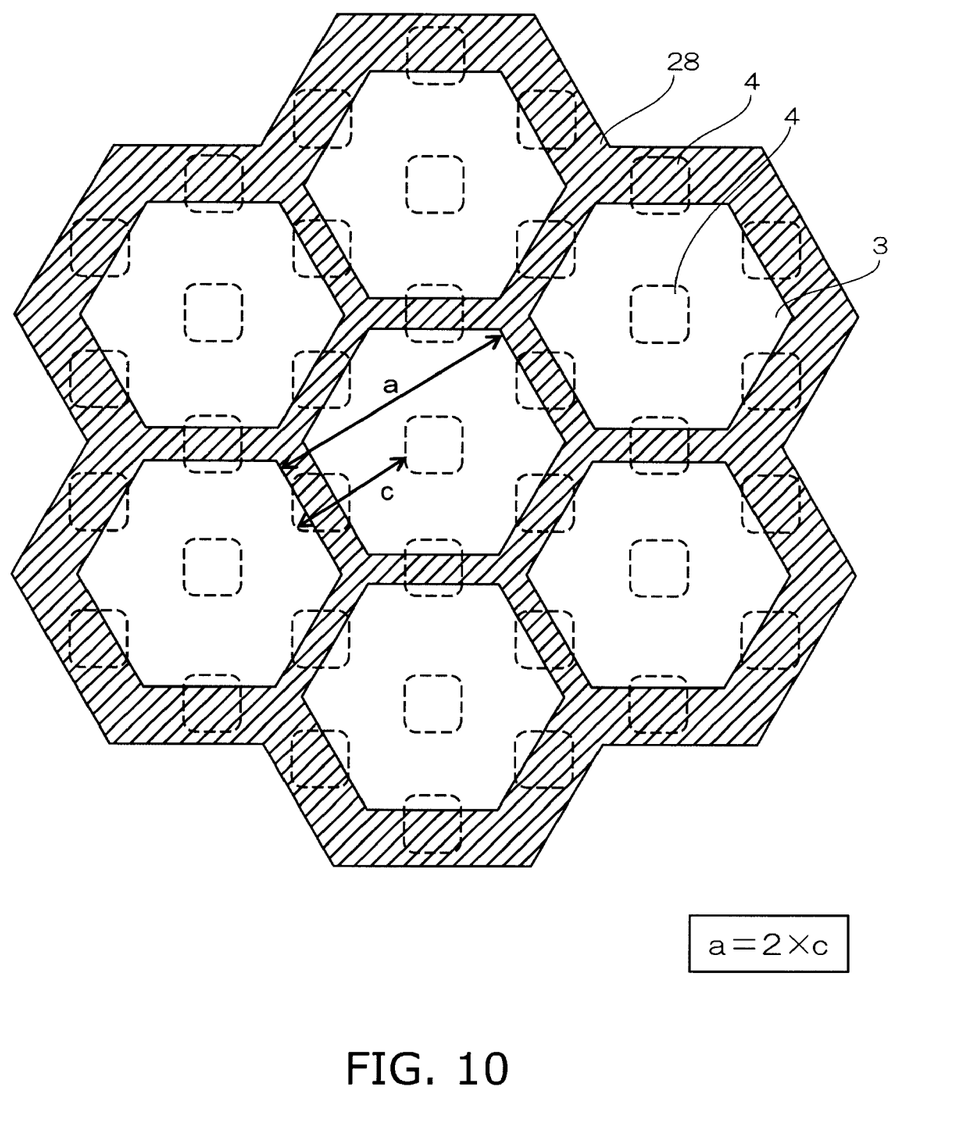
FIG. 10 is a plan view illustrating the positional relationship between the superjunction structure and the gate electrode in a vertical power MOSFET according to a variation of the fifth embodiment.

FIG. 10 is a plan view illustrating the positional relationship between the superjunction structure and the gate electrode in a vertical power MOSFET according to a variation of the fifth embodiment.

As shown in FIG. 10, in this variation, as viewed from above, p-pillar layers 4 shaped like rectangular islands are equally spaced along three directions making an angle of 120 degrees with each other. The portion between the p-pillar layers 4 is an n-pillar layer 3. Thus, one p-pillar layer 4 is surrounded by six p-pillar layers 4 arranged equidistantly from the one p-pillar layer 4. If the centers of these six p-pillar layers 4 are connected by line segments, an imaginary regular hexagon is formed. The gate electrode 28 is formed in a honeycomb configuration along this imaginary regular hexagon. The arrangement period a of the portions of the gate electrode 28 that are arranged along the arranging direction of the p-pillar layers 4 is twice the arrangement period c of the p-pillar layers 4. In this variation again, the gate electrode can be formed along the outer periphery of the p-base layer. Thus the spreading resistance in the directly underlying region of the p-base layer can be reduced, and the ON resistance can be reduced.

The invention has been illustrated with reference to the first to fifth embodiments and variations thereof. However, the invention is not limited to these embodiments. For example, the above embodiments assume the first conductivity type as n-type and the second conductivity type as p-type. However, it is also possible to assume the first conductivity type as p-type and the second conductivity type as n-type.

The above embodiments can be combined with each other as long as technically feasible. Such combinations of the above embodiments are also encompassed within the scope of the invention. Furthermore, any design modifications and component additions to the above embodiments and combinations thereof are also encompassed within the scope of the invention.

In this invention, the method for forming a superjunction structure is not specifically limited. The superjunction structure can be formed by various methods, such as the method of repeating a plurality of iterations of ion implantation and epitaxial growth, the method of forming a trench groove followed by buried growth, and the method of forming a trench groove followed by ion implantation into the sidewall.

In the structure shown in FIG. 6, a RESURF layer 11 is formed in the edge termination section. However, the edge termination structure according to the invention is not limited thereto. For example, a field plate structure can also be used. Furthermore, in the structure shown in FIG. 6, the edge termination section also has a superjunction structure similar to that of the device section. However, the edge termination section may have a superjunction structure different from that of the device section in arrangement period or dopant concentration. Alternatively, an edge termination section without the superjunction structure can also be used.

In the MOSFETs described in the above embodiments, silicon (Si) is used as a semiconductor. However, the invention is not limited thereto, but the semiconductor can illustratively be any one of silicon carbide (SiC), gallium nitride (GaN), and other compound semiconductors, and diamond and other wide bandgap semiconductors.

In the above embodiments, a MOSFET having a superjunction structure is illustrated as a power semiconductor device. However, the power semiconductor device according to the invention is not limited to MOSFETs. The structure according to the invention is also applicable to any devices such as a SBD (Schottky Barrier Diode), a hybrid device of MOSFETs and SBDs, a SIT (Static Induction Transistor), and an IGBT (Insulated Gate Bipolar Transistor). For example, the above embodiments can be applied to an IGBT if a p-layer for supplying holes is formed between the drain electrode 1 and the n$^+$-drain layer 2.

The invention claimed is:

1. A power semiconductor device comprising:
   a first semiconductor layer of a first conductivity type;
   a second semiconductor layer of the first conductivity type and a third semiconductor layer of a second conductivity type formed on the first semiconductor layer of the first conductivity type and alternately arranged along at least one direction parallel to an upper face of the first semiconductor layer of the first conductivity type;
   a first main electrode electrically connected to the first semiconductor layer of the first conductivity type;
   a fourth semiconductor layer of the second conductivity type selectively formed in an upper face of the second semiconductor layer of the first conductivity type and an upper face of the third semiconductor layer of the second conductivity type;
   a fifth semiconductor layer of the first conductivity type selectively formed in an upper face of the fourth semiconductor layer of the second conductivity type;
   a second main electrode electrically connected to the fourth semiconductor layer of the second conductivity type and the fifth semiconductor layer of the first conductivity type; and
   a control electrode formed above the second semiconductor layer of the first conductivity type, the third semiconductor layer of the second conductivity type, the fourth semiconductor layer of the second conductivity type, and the fifth semiconductor layer of the first conductivity type via a gate insulating film,
   the control electrode including:
      first portions periodically arranged along a first direction selected from arranging directions of the third semiconductor layer of the second conductivity type, the third semiconductor layer of the second conductivity type having a shortest arrangement period in the first direction, and
      second portions periodically arranged along a second direction, the second direction being parallel to the upper face of the first semiconductor layer of the first conductivity type and crossing the first direction, and
   the arrangement period of the first portions being m times the arrangement period of the third semiconductor layer of the second conductivity type, where m is an integer not less than 2.

2. The power semiconductor device according to claim 1, wherein the arrangement period of the second portions is shorter than the arrangement period of the first portions.

3. The power semiconductor device according to claim 1, wherein the arrangement period of the first portions is twice the arrangement period of the third semiconductor layer of the second conductivity type.

4. The power semiconductor device according to claim 3, wherein said m is an even number, and the phase of arrangement of the first portions in a region between the second portions is out of phase by half the period relative to the phase of arrangement of the first portions in another region between the second portions located adjacent to said region.

5. The power semiconductor device according to claim 3, wherein the control electrode is shaped like a grid composed of the first portions and the second portions.

6. The power semiconductor device according to claim 5, wherein a dopant concentration in a part of the second semiconductor layer of the first conductivity type on which the control electrode is not formed is higher than a dopant concentration in a part of the second semiconductor layer of the first conductivity type on which the control electrode is formed.

7. The power semiconductor device according to claim 1, wherein the control electrode is formed in a staggered grid configuration.

8. The power semiconductor device according to claim 1, wherein the second semiconductor layer of the first conductivity type and the third semiconductor layer of the second conductivity type are formed in a stripe configuration.

9. The power semiconductor device according to claim 1, wherein
   one of the second semiconductor layer of the first conductivity type and the third semiconductor layer of the second conductivity type is arranged in a matrix configuration, and
   other of the second semiconductor layer of the first conductivity type and the third semiconductor layer of the second conductivity type surrounds the one in a grid configuration.

10. The power semiconductor device according to claim 1, wherein
    one of the second semiconductor layer of the first conductivity type and the third semiconductor layer of the second conductivity type is equally spaced along three directions making an angle of 120 degrees with each other, and
    other of the second semiconductor layer of the first conductivity type and the third semiconductor layer of the second conductivity type surrounds the one.

11. A power semiconductor device comprising:
    a first semiconductor layer of a first conductivity type;
    a second semiconductor layer of the first conductivity type and a third semiconductor layer of a second conductivity type formed on the first semiconductor layer of the first conductivity type and alternately arranged along at least one direction parallel to an upper face of the first semiconductor layer of the first conductivity type;
    a first main electrode electrically connected to the first semiconductor layer of the first conductivity type;
    a fourth semiconductor layer of the second conductivity type selectively formed in an upper face of the second semiconductor layer of the first conductivity type and an upper face of the third semiconductor layer of the second conductivity type;
    a fifth semiconductor layer of the first conductivity type selectively formed in an upper face of the fourth semiconductor layer of the second conductivity type;
    a second main electrode electrically connected to the fourth semiconductor layer of the second conductivity type and the fifth semiconductor layer of the first conductivity type; and
    a control electrode formed above the second semiconductor layer of the first conductivity type, the third semiconductor layer of the second conductivity type, the fourth semiconductor layer of the second conductivity type, and the fifth semiconductor layer of the first conductivity type via a gate insulating film,
    the second semiconductor layer of the first conductivity type and the third semiconductor layer of the second conductivity type being formed in a stripe configuration, and
    the control electrode including:

first portions periodically arranged along a first direction, and second portions periodically arranged along a second direction, the second direction crossing the first direction.

12. The power semiconductor device according to claim 11, wherein the first portions are periodically arranged along a first direction selected from arranging directions of the third semiconductor layer of the second conductivity type, the third semiconductor layer of the second conductivity type having a shortest arrangement period in the first direction, and the second portions are periodically arranged along a second direction, the second direction being parallel to the upper face of the first semiconductor layer of the first conductivity type and crossing the first direction, and the arrangement period of the first portions being m times the arrangement period of the third semiconductor layer of the second conductivity type, where m is an integer not less than 2.

13. The power semiconductor device according to claim 12, wherein the arrangement period of the second portions is shorter than the arrangement period of the first portions.

14. The power semiconductor device according to claim 12, wherein the arrangement period of the first portions is twice the arrangement period of the third semiconductor layer of the second conductivity type.

15. The power semiconductor device according to claim 14, wherein said m is an even number, and the phase of arrangement of the first portions in a region between the second portions is out of phase by half the period relative to the phase of arrangement of the first portions in another region between the second portions located adjacent to said region.

16. The power semiconductor device according to claim 14, wherein the control electrode is shaped like a grid composed of the first portions and the second portions.

17. The power semiconductor device according to claim 16, wherein a dopant concentration in a part of the second semiconductor layer of the first conductivity type on which the control electrode is not formed is higher than a dopant concentration in a part of the second semiconductor layer of the first conductivity type on which the control electrode is formed.

18. A power semiconductor device comprising:

a first semiconductor layer of a first conductivity type;

a second semiconductor layer of the first conductivity type and a third semiconductor layer of a second conductivity type formed on the first semiconductor layer of the first conductivity type and alternately arranged along at least one direction parallel to an upper face of the first semiconductor layer of the first conductivity type;

a first main electrode electrically connected to the first semiconductor layer of the first conductivity type;

a fourth semiconductor layer of the second conductivity type selectively formed in an upper face of the second semiconductor layer of the first conductivity type and an upper face of the third semiconductor layer of the second conductivity type;

a fifth semiconductor layer of the first conductivity type selectively formed in an upper face of the fourth semiconductor layer of the second conductivity type;

a second main electrode electrically connected to the fourth semiconductor layer of the second conductivity type and the fifth semiconductor layer of the first conductivity type; and a control electrode formed above the second semiconductor layer of the first conductivity type, the third semiconductor layer of the second conductivity type, the fourth semiconductor layer of the second conductivity type, and the fifth semiconductor layer of the first conductivity type via a gate insulating film, one of the second semiconductor layer of the first conductivity type and the third semiconductor layer of the second conductivity type being formed in an island configuration, and equally spaced along the at least one direction, other of the second semiconductor layer of the first conductivity type and the third semiconductor layer of the second conductivity type surrounding the one, and the control electrode including:

first portions periodically arranged along the one direction, and second portions periodically arranged along a second direction, the second direction crossing the one direction.

19. The power semiconductor device according to claim 18, wherein the one of the second semiconductor layer of the first conductivity type and the third semiconductor layer of the second conductivity type is arranged in a matrix configuration.

20. The power semiconductor device according to claim 19, wherein the control electrode is formed in a staggered grid configuration.

* * * * *